United States Patent
Sauer

(10) Patent No.: US 7,463,094 B2
(45) Date of Patent: Dec. 9, 2008

(54) LINEARIZED CLASS AB BIASED DIFFERENTIAL INPUT STAGE

(76) Inventor: Don Roy Sauer, 1499 Cliff Dr., San Jose, CA (US) 95132

( * ) Notice: Subject to any disclaimer, the term of this patent is extended or adjusted under 35 U.S.C. 154(b) by 111 days.

(21) Appl. No.: 11/694,823

(22) Filed: Mar. 30, 2007

(65) Prior Publication Data

US 2008/0238545 A1    Oct. 2, 2008

(51) Int. Cl.
*H03F 3/45* (2006.01)
(52) U.S. Cl. .................... 330/255; 330/257
(58) Field of Classification Search ............ 330/255, 330/257, 252; 323/312–316
See application file for complete search history.

(56) References Cited

U.S. PATENT DOCUMENTS

| | | | |
|---|---|---|---|
| 4,723,110 A | 2/1988 | Voorman | |
| 4,965,528 A | 10/1990 | Okanobu | |
| 5,006,818 A | 4/1991 | Koyama | |
| 5,337,007 A | 8/1994 | Barrett, Jr. | |
| 5,389,895 A | 2/1995 | Moore et al. | |
| 5,420,538 A | 5/1995 | Brown | |
| 5,500,623 A | 3/1996 | Kimura | |
| 5,838,149 A * | 11/1998 | Perraud | 323/315 |
| 5,841,603 A * | 11/1998 | Ramalho et al. | 360/68 |
| 5,966,050 A * | 10/1999 | Yoshino et al. | 330/255 |
| 6,046,875 A | 4/2000 | Siniscalchi et al. | |
| 6,188,281 B1 | 2/2001 | Smith et al. | |
| 6,496,067 B1 | 12/2002 | Behzad et al. | |

\* cited by examiner

*Primary Examiner*—Robert Pascal
*Assistant Examiner*—Hieu P Nguyen

(57) ABSTRACT

A linearized bipolar differential input stage that contains two high gain current mirrors coupled in series with the input voltage signal through the input transistors to allow the output differential current to greatly exceed the DC output current in a Class AB fashion. The extended output current range over and above the DC current significantly lowers the percentage of effects for both DC offset and noise in the output signal path. Non-linearity cancellation is also optimized for the lowest level of input distortion through adjusting transistor area ratios.

9 Claims, 5 Drawing Sheets

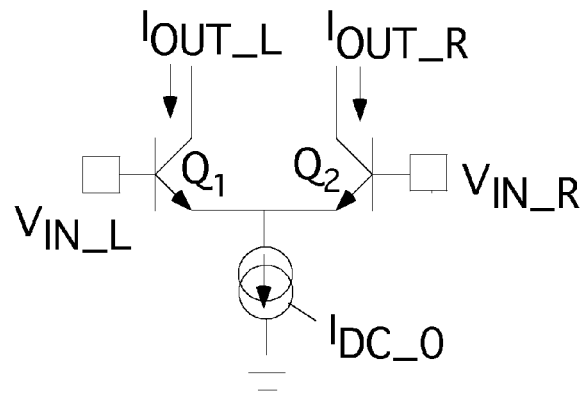
FIG. 1 (PRIOR ART 1)
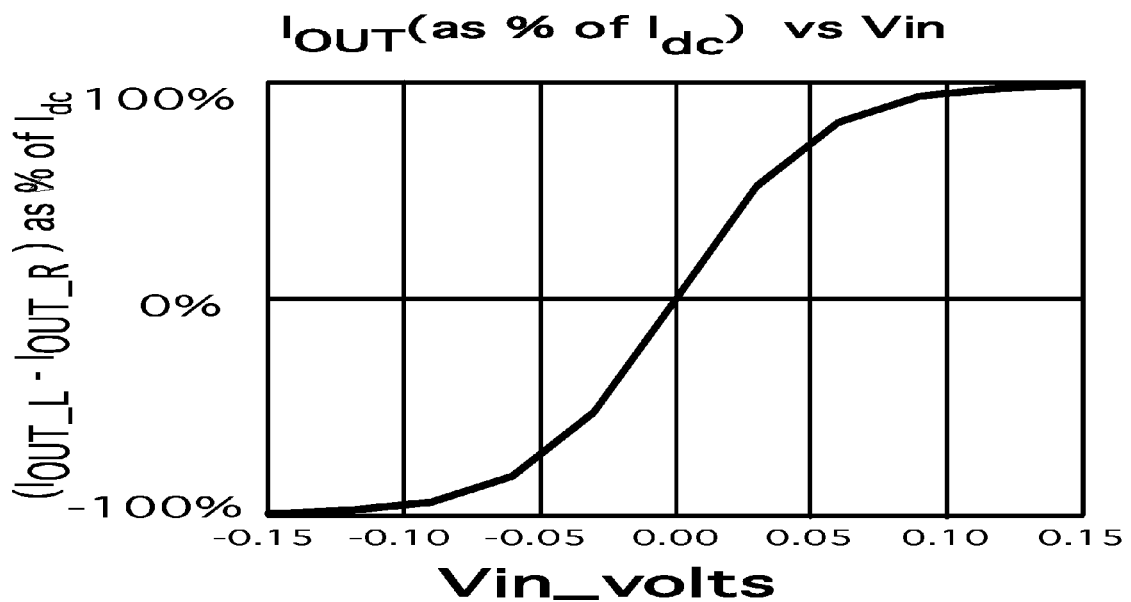
FIG. 2 (PRIOR ART 1)

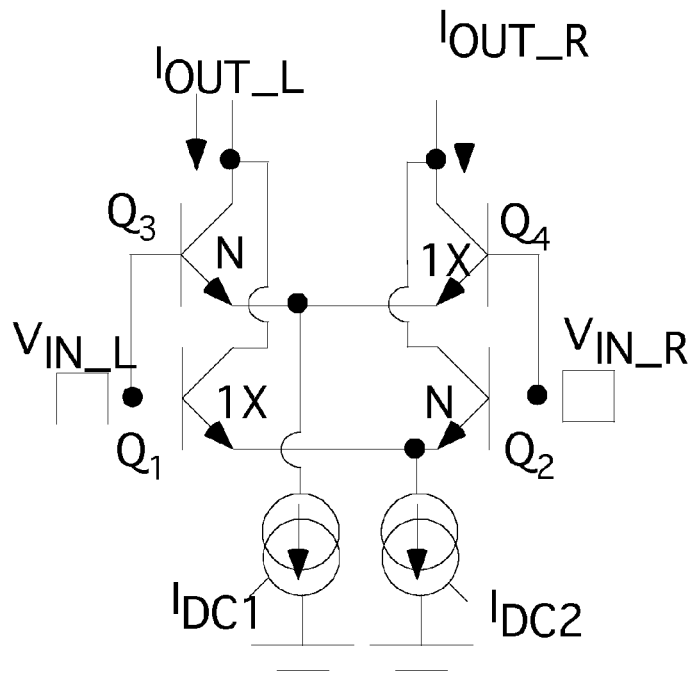
FIG. 3 (PRIOR ART 2)
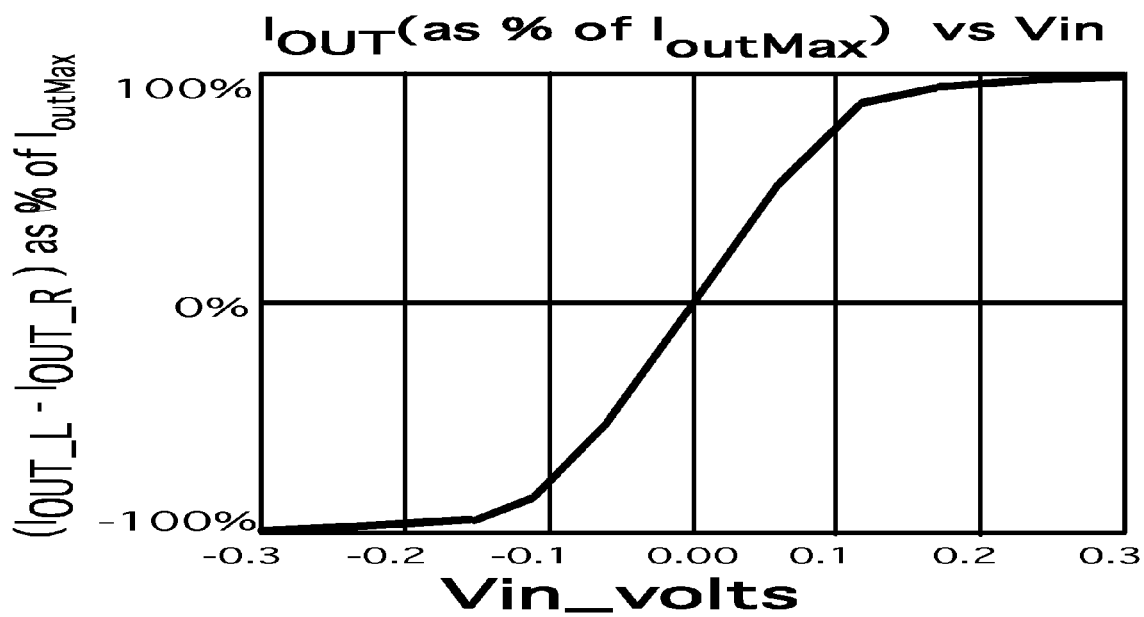
FIG. 4 (PRIOR ART 2)

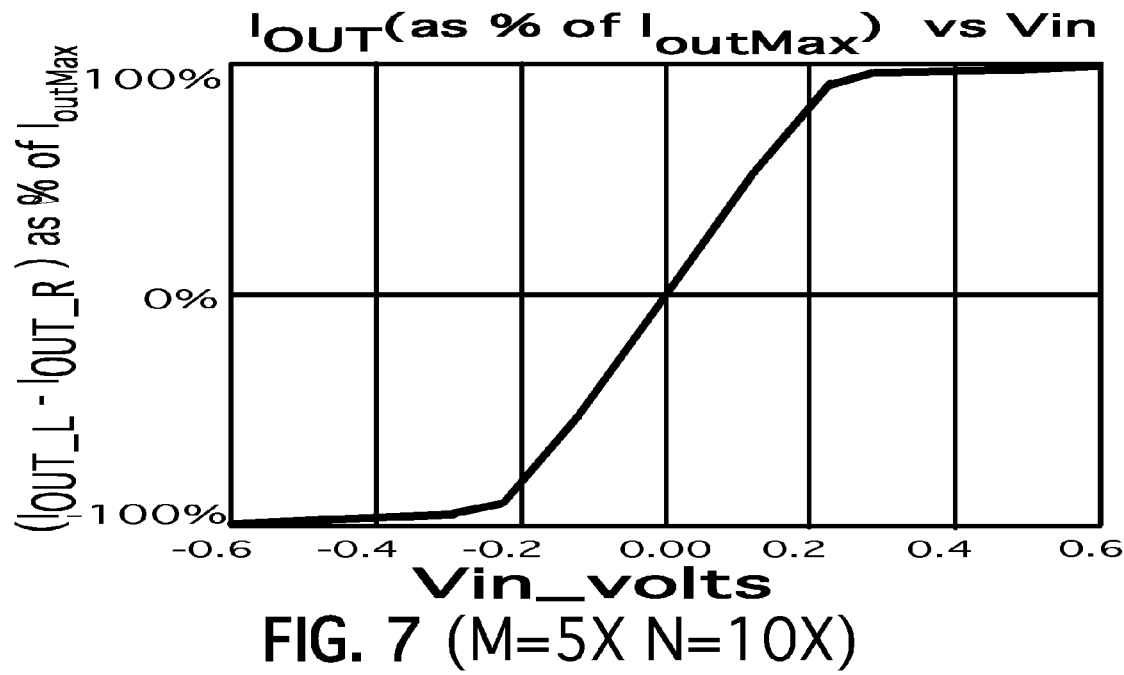
FIG. 7 (M=5X N=10X)
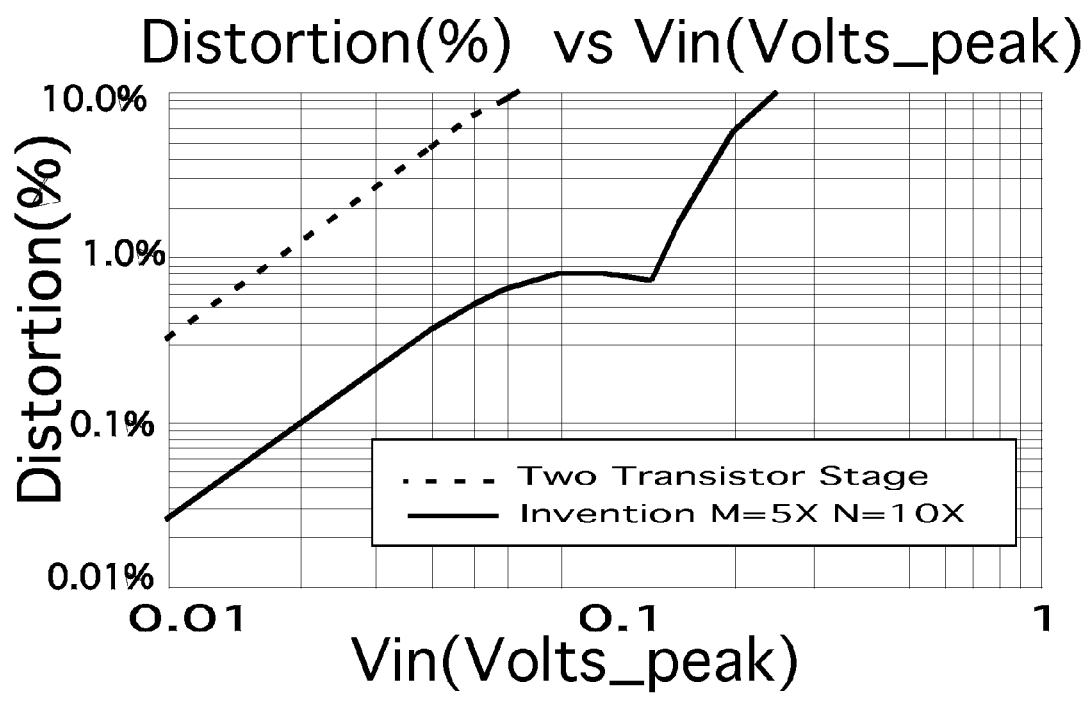
FIG. 8

LINEARIZED CLASS AB BIASED DIFFERENTIAL INPUT STAGE

FIELD OF THE INVENTION

This invention relates to a linear differential input stage that contains two high gain current mirrors coupled in series with the input voltage signal to allow the maximum differential output current to greatly exceed the zero signal DC output current. The extended output current range significantly lowers the effective percentage of both DC offset and noise compared to the output signal. Non-linearity cancellation further extends the usable input voltage range, and is optimized for the lowest level of distortion through adjusting the Class AB bias defined by transistor area ratios.

BACKGROUND

Differential input stages using bipolar junction transistors are inherently non-linear. A simple differential stage shown in FIG. 1 only responds to an input signal voltage lower than 60 mV in magnitude. At higher input voltage levels, one transistor begins to completely turn off while the other conducts all the current. The resulting output current effectively reaches a limit for input voltages in excess of 60 mV. The input voltage to output current transfer function for the circuit of FIG. 1 is shown in FIG. 2. The input signal often needs to be much lower than 60 mV. When signal distortion is critical, the input peak voltage must be kept below 17 mV for the distortion to be kept below 1%. This is a factor of ten lower in voltage than the 200 mV level commonly is used in audio applications.

One method to increase the maximum allowable input signal range was proposed by Okanobu in U.S. Pat. No. 4,965,528 issued Oct. 23, 1990. In this invention which is shown in FIG. 3, the outputs collectors of two equally biased differential input stages which both have opposing N:1 area ratios are summed together. FIG. 4 shows that the resulting input voltage range on the transfer curve is effectively doubled above that of a two transistor differential stage shown in FIG. 2. There is also a reduction in distortion due to a limited amount of non-linearity cancellation between the two stages. This lowering of distortion further to extend the useful input voltage range. This input stage is not Class-AB biased since the supply current remains constant as a regardless of input voltage.

BRIEF SUMMARY OF THE INVENTION

This invention improves the signal quality of an input differential stage in terms of headroom, distortion, DC offset, and noise. The invention does this by significantly extending the maximum range of the output current to be over and above the DC level in a class AB fashion. This in turn significantly extends the maximum signal range to also be over and above the background offset, noise and distortion, thereby improving signal quality.

BRIEF DESCRIPTION OF THE DRAWINGS

Non-limiting and non-exhaustive embodiments are described with reference to the following drawings:

FIG. 1 illustrates a two Bipolar transistor differential input stage which is biased by a current source Idc_0 connected to both emitters, and which provides a differential output current across the two collectors which is a function to the difference in voltage between the two bases.

FIG. 2 is the transfer function of the input differential base voltage to output differential collector current for the circuit of FIG. 1 when the differential output current is expressed at a percentage of the common current source Idc_0.

FIG. 3 illustrates a prior art differential input stage proposed by Okanobu in U.S. Pat. No. 4,965,528 issued Oct. 23, 1990.

FIG. 4 is the transfer function of differential input stage proposed by Okanobu in U.S. Pat. No. 4,965,528 issued Oct. 23, 1990.

FIG. 7 is the transfer function of invention of FIG. 5 for the embodiment where the areas of N/M equal 5/10.

FIG. 8 illustrates the Total Harmonic Distortion for both the differential input stage of FIG. 1 and the invention of FIG. 5 for the embodiment where the areas of N/M equal 5/10.

DETAILED DESCRIPTION OF THE PREFERRED EMBODIMENT

Figure 5:
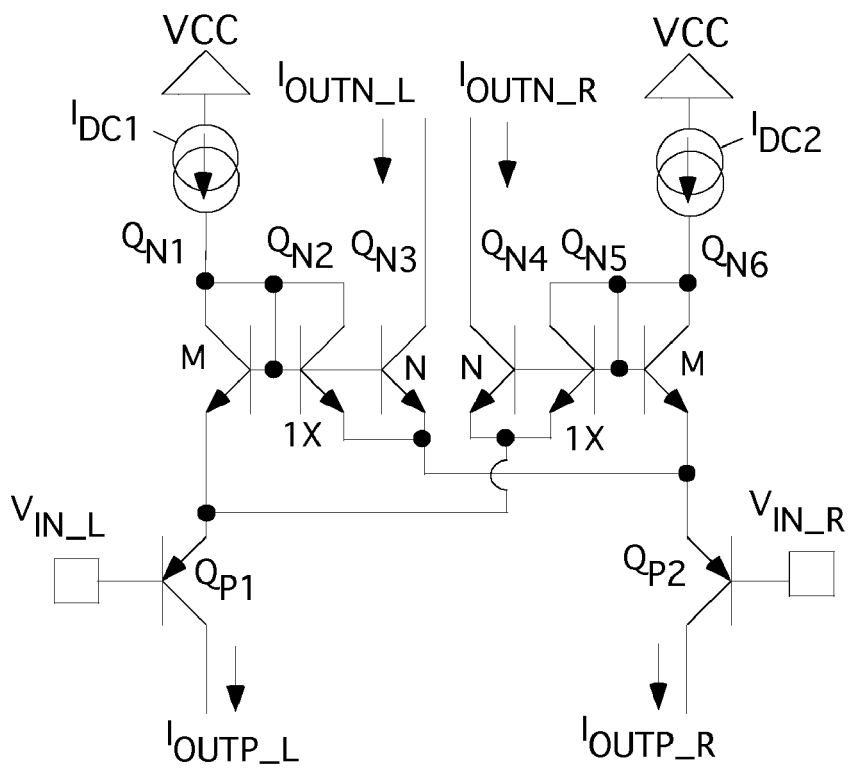
FIG. 5 illustrates the invention consisting of two input transistors of type one and six transistors of type two where one input transistor diode couples its signal to the base of a current mirror, and the common emitters of that current mirror are coupled to the emitter of the other input transistor, and visa versa.

Bipolar junction differential input stages are inherently non-linear and have a limited useable input voltage range. A simple differential stage shown in FIG. 1 can only respond to an input signal voltage below 60 mV in magnitude. Above 60 mV, one transistor begins to completely turn off while the other conducts all the current of current source Idc_0. The differential output current follows a well know hyperbolic tangent function of the differential input voltage. It is given in the following equation (1).

$$Iout\_differential = Ibias\_dc * TanH(Vin\_differential / (2*kt/q)) \quad (1)$$

The graph of this transfer function is shown in FIG. 2. The output current in this graph is expressed as percentage of the maximum available output current defined by Idc_0. The output collector differential current comes close to 100% then maximum amount for differential input voltage above 100 mV. In most applications The differential output collector currents of FIG. 1 are converted to a single bi-directional output current through the use of a turn-around connected to the two collectors.

Input stages have three important types of errors. A differential input voltage above 17 mV will generate distortion above 1%. This limitation can reduce the available output current to less than 50% of the maximum available output current. The need to limit input voltage also adversely impacts the effects of DC offset and noise. A typical area mismatch between two matched bipolar transistors is about 4% in terms of standard deviation. This corresponds to a 1 mV standard deviation input offset voltage, which is needed to counter the 4% mismatch. A differential mismatch of 1 mV corresponds to the differential output DC current error being within 4% of the maximum possible output current for 64% of the time.

Noise can be treated as moving offset, or offset can be treated like DC noise. The standard deviation of offset is the same as RMS for noise. The shot noise in bipolar transistors is due to the fact that individual charge carriers are what travel across the base region of the transistor. This shot noise is purely statistical, and cannot be removed by any improvements in transistor processing. Shot noise can be modeled as a percentage mismatch of the DC current. The ratio of Shot Noise RMS randomness to DC current for a single transistor is given below by the following equation (2).

$$\text{Shot\_noise}/I\_dc = \text{sqrt}(2*q*I\_dc*BW\_\text{noise})/I\_dc \quad (2)$$

For audio applications, the bandwidth is from 20 Hz to 20 kHz. If both transistors are both biased up at 1 uA, the shot noise works out to be about a 0.00566% AC mismatch in area, which is about 700 times smaller than the typical 4% DC mismatch. The mismatch effects of shot noise decreases with the square root of the amount of DC current. One hundred times more DC current through a transistor effectively makes the current ten times less random. Outside of increasing the DC current, anything that tends to lower the effects of DC offset, also lowers the effects of AC shot noise.

One embodiment of the invention is shown in FIG. 5. Two identical current sources Idc1 and Idc2 bias up all the transistors. In this embodiment, both M and N are set to 10×. Transistor Qp1 and Qp2 match in size, but their nominal size is not critical. When the two input voltages Vin_L and Vin_R are equal, all transistors have the same voltage at their emitters. All NPNs will therefore share the same emitter base voltage, and all PNPs share the same emitter base voltages. With M being equal to N, transistors Qn1, Qn3, Qn4, and Qn6 will all draw the same current. Transistors Qn2 and Qn5 will be 1/10th of the others. So the output currents IoutN_L and IoutN_R will both be about 10% less than the currents Idc1 or Idc2.

Figure 6:
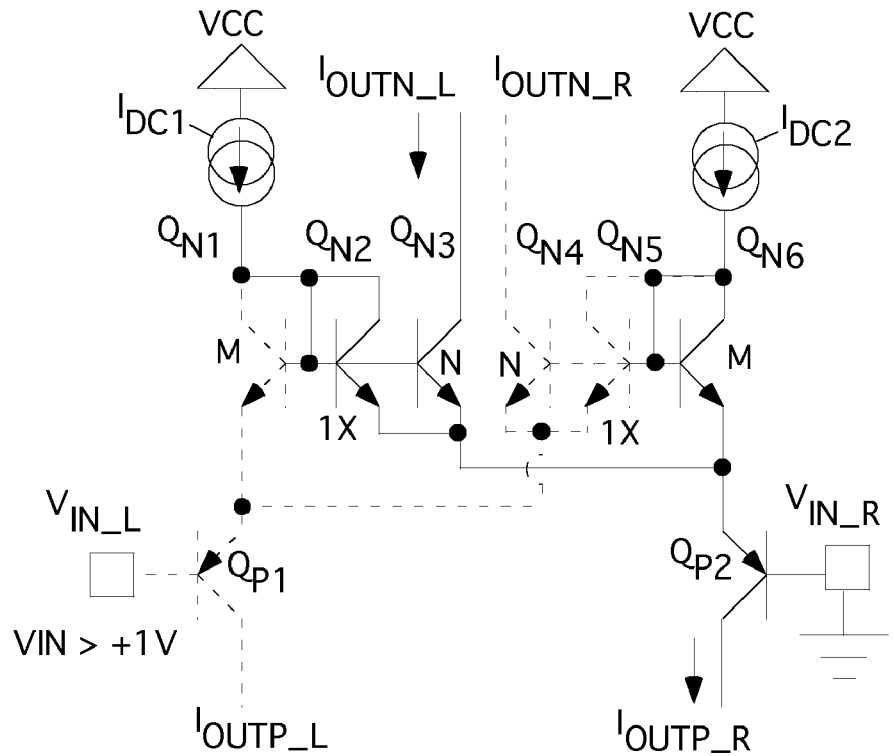
FIG. 6 illustrates which transistors of FIG. 5 turn off when a input voltage higher than 1 volt is applied to the left input Vin_L relative to the right input Vin_R.

FIG. 6 shows which transistors turn off when the left input Vin_L is greater than a volt higher than the right input Vin_R. Transistors Qn1, Qn4, Qn5 and Qp1 will all be off. Transistors Qn2 and Qn3 will form a current mirror with a gain of 10. So the maximum output current at node IoutN_L will be ten times larger that current source Idc1. The collector current in Qn3 has increased greater than a factor of ten over its DC current. The current source Idc2 is coupled to the emitter of Qp2 through the diode Qn6. When the left input Vin_L is a volt lower than the right input Vin_R, the transistors that where off will come on as will those that where on will go off. In this case the collector current of Qn4 will draw ten times its DC current. The differential output current is therefore operating in a class AB mode because its maximum output current is much larger than DC current.

Both the DC mismatch and AC shot noise can be defined as a percentage of DC bias current. By extending the maximum output current range through the use of current mirrors, the percentage of DC mismatch and AC shot noise has decreased almost a factor of ten compared to the maximum available output current. The improvement is not quite up to the N:1 ratio of the current mirrors since adding more transistors in the input stage tends to adds more offset and noise. The method to finding the actual percentage error involves doing a series of mismatch tests on the invention.

For the case of the circuit in FIG. 1, there is only one matched pair of transistors. If one of the transistors is assumed to have a typical 4% standard deviation mismatch, then the typical output standard deviation current error will be 4% of the maximum available output current. For the case of the circuit in FIG. 5, five matched pairs of transistors now need to be considered. Transistor Qp1 needs to match Qp2, Qn1 needs to match Qn6, Qn2 needs to match Qn5, Qn3 needs to match Qn4, and the two current sources Idc1 and Idc2 can be assumed to have the same transistor mismatch. Each of the matched pairs are one by one given a 4% mismatch, and the effects on the output current in terms of percent of maximum output current are then made into a table which is given below in TABLE 1. The results are then added up as a square root of the sum of the squares to give the output standard deviation error of 0.59%. This is not quite ten times smaller than the 4% mismatch error for two transistors.

TABLE 1

INDIVIDUAL 4% PAIR MISMATCH SENSITIVITY
FOR EACH TRANSISTOR MATCHED PAIR
AS A PERCENT OF MAXIMUM OUTPUT CURRENT

| Misatched_Pair | Error % |
| --- | --- |
| Qp1/Qp2 | 0.3633% |
| Qn1/Qn6 | 0.208% |
| Qn2/Qn5 | 0.05% |
| Qn3/Qn4 | 0.208% |
| Idc1/Idc2 | 0.3633% |
| RMS_SUM | 0.59% |

Depending on design details, the actual result could be significantly better. A pair of 10× transistors match about 3 times better than 1× transistors, and current source are often built using resistors which match well under 1%. Adding 4 more transistor pairs to a single pair input stage typical doubles the amount of offset and noise. Since the maximum available output current increases a factor of ten, the effective percentage of offset and noise will be reduced by at least a factor of five corresponding to a 14 dB improvement. For this calculation, the improvement is more like a 16.6 dB improvement for both offset and signal to noise. Actual results could come closer to the 20 dB predicted by the N:1 ratio.

In the case of a BiCMOS process, there is an addition advantage to the invention. The Lateral PNPs used in a BiCMOS process have a much higher reverse emitter base breakdown voltage than do the NPNs. Exceeding the reverse emitter base breakdown voltage of an NPN is destructive. Since all NPN emitters are connected to Lateral PNP emitters, they therefore all protected from reverse emitter base breakdown. This very same technique is used in the u741. This allows either input to be connected to either supply voltage without destroying the NPN input transistors. All Op Amps without this feature require the use of input clamp diodes. If the left input voltage Vin_L of FIG. 6 where to be raised to the full supply voltage, the emitter base voltage of Qp1 can be reversed biased at full supply without breaking down. This allows all the emitter base junctions of Qn1, Qn4, and Qn5 to be reversed biased safely below their breakdown voltage.

The invention's input signal range is another factor of two over and above the prior art of FIG. 3 as can be seen by comparing FIG. 7 to FIG. 4. The invention also has the same type of limited non-linearity cancellation as in the prior art of FIG. 3. The degree of cancellation is controllable by adjusting the level of DC current. For optimum low distortion, the value of M is set to 5×. The distortion versus peak input signal voltage curve of FIG. 6 shows the distortion performance for the M/N=5/10 embodiment. Using the 1% distortion level as a specification, FIG. 8 shows that the input voltage peak level can now be increase from 17 mV to about 130 mV. This is important for audio applications and filter applications requiring the use operational transconductance amplifiers.

State of the art bipolar transistors can operate at very low current levels. A voltage to current relations of operational transconductance amplifiers inside an integrated circuit can approach G-ohms. This makes it possible to built low frequency filters using only on-chip-capacitors. In some system-on-a-chip applications, the signal may be very small. Removing the requirement for external capacitors can remove an important source of external interference. The higher the voltage levels an operational transconductance amplifier can carry with out distortion, the high the signal to noise ratio of the on-chip-filter.

Figure 9:
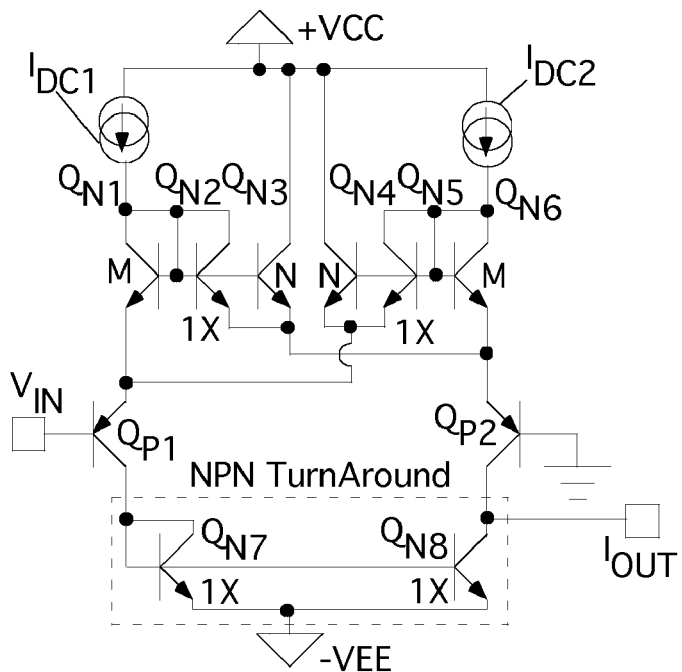
FIG. 9 illustrates how a full Operational Transconductance Amplifier can be formed by subtracting two collector output currents through the use of a current mirror turn-around.

The invention shown in FIG. 5 shows that the output current comes out as both NPN collectors and PNP collectors. Adding a NPN turn-around to the PNP outputs will subtract the PNP collector currents IoutP_L from IoutP_R to produce a bi-directional output current, as is shown in FIG. 9. The resulting operational transconductance amplifier of FIG. 9 is typically connected to a following identical operational transconductance amplifier biased at the same input common mode DC voltage. The input voltage distortion limitation required by the following operational transconductance amplifier, also limits the output voltage swing above the input common mode to be under 200 mv, which will prevent the saturation of Qp2.

Figure 10:
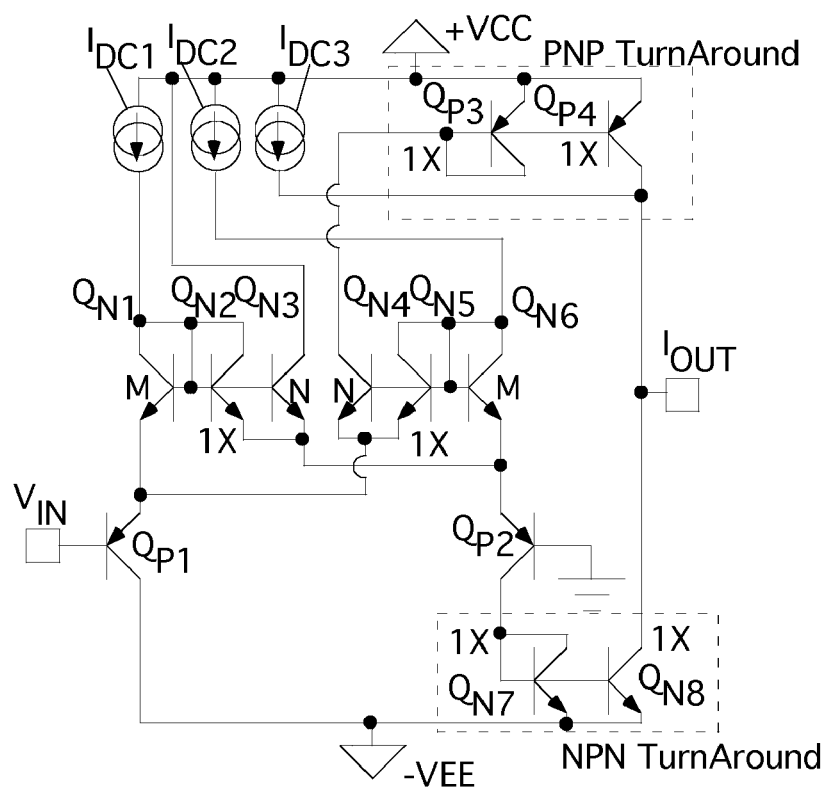
FIG. 10 illustrates both types of collector output currents being summed together by using of a current source and two turnarounds to form a full Operational Transconductance Amplifier with a rail-to-rail output.

When an operational transconductance amplifier with a true rail-to-rail output is required, an NPN collector output current can be subtracted from a PNP collector output to create the output current as shown in FIG. 10. Instead of taking three turnarounds to create a rail-to-rail output, it only takes two turnarounds to build a full rail-to-rail current output. There is a DC current difference between the NPN's collector output and that of the PNP's collector outputs. Depending on the ratio of transistor area M to transistor area N, a current Idc3 can be added which is about the same size as currents Idc1 or Idc2.

While the invention has been shown in this particular embodiment, it will be understood by those skilled in the art that all NPNs and be substituted with PNPs and all PNPs be substituted with NPNs, as long as the correct direction of the two current sources are observed. Likewise CMOS devices can be substituted for bipolar devices, so long as polarities are correctly observed, and provided all CMOS transistors operate in the sub-threshold mode. All of these substitutions can all be made with out departing from the spirit and scope of the invention

What is claimed is:

1. A linearized Class AB biased differential circuit comprising:
   an input matched transistor pair consisting of a first type one transistor and a second type one transistor; and
   a first current mirror composed of a second type two transistor of a unity size having said collector and base connected to base of third type two transistor of a size N having emitter of the second type two transistor connected to the emitter the third type two transistor; and
   a second current mirror composed of a fifth type two transistor of unity size having said collector and base connected to base of fourth type two transistor of size N having emitter of the fifth type two transistor connected to the emitter the fourth type two transistor; and
   a first diode consisting of a first type two transistor of a M size having said collector and base connected; and
   a second diode consisting of a sixth type two transistor of M size having said collector and base connected; and
   a matched pair of current sources consisting of a first current source and a second current source; and
   respective emitter of said first type one transistor is coupled to emitter of first diode and emitters of second current mirror; and
   respective emitter of said second type one transistor is coupled to emitter of second diode and emitters of first current mirror; and
   respective collector and base of said first diode and common bases of said first current mirror are connected to first current; and
   respective collector and base of said second diode and common bases of said second current mirror are connected to second current; and
   respective bases of said first type one transistor and second type one transistor are connect to a first and second input terminals; and
   respective collectors of said first type one transistor and second type one transistor are connect to a first and second output terminals; and
   respective collectors of said third type two and fourth type two transistor are connect to a third and fourth output terminals; and
   such that the said size N defines a maximum output current gain relative to the matched current sources; and
   a ratio of said size M to said size N defines a DC output current relative to the matched current sources.

2. A linearized Class AB biased differential circuit comprising:
   an input matched transistor pair consisting of a first type one transistor and a second type one transistor; and
   a second matched transistor pair consisting a first type two transistor of a size M and a sixth type two transistor of size M; and
   a third matched transistor pair consisting a second type two transistor of unity size and a fifth type two transistor of unity size; and
   a fourth matched transistor pair consisting a third type two transistor of a size N and a fourth type two transistor of size N; and
   a matched pair of current sources consisting of a first current source and a second current source; and
   respective collectors and bases of said first type two transistor and second type two transistor are connected to base of said third type two transistor and the first current source; and
   respective collectors and bases of said fifth type two transistor and sixth type two transistor are connected to base of said fourth type two transistor and the second current source; and
   respective emitters of said first type two transistor, fourth type two transistor, and fifth type two transistor are connected to the emitter of said first type one transistor; and
   respective emitters of said second type two transistor, third type two transistor, and sixth type two transistor are connected to the emitter of said second type one transistor; and
   respective bases of said first type one transistor and second type one transistor are connect to a first and second input terminals; and
   respective collectors of said first type one transistor and second type one transistor are connect to a first and second output terminals; and
   respective collectors of said third type two and fourth type two transistor are connect to a third and fourth output terminals; and such that the said size N defines a maximum output current gain relative to the matched current sources; and a ratio of said size M to said size N defines a DC output current relative to the matched current sources.

3. A linearized Class AB biased differential circuit of claim 1, wherein said size N is substantially greater than unity such that a maximum available output current is substantially greater than a DC output current.

4. A linearized Class AB biased differential circuit of claim 3, wherein the high ratio of said maximum output current to the DC output current substantially attenuates the effects of DC offset as a percentage of available output current.

5. A linearized Class AB biased differential circuit of claim 3, wherein the high ratio of said maximum output current to the DC output current substantially attenuates the effects of shot noise as a percentage of available output current.

6. A linearized Class AB biased differential circuit of claim 1, wherein the ratio of said M to N is optimized to extend a below one percent distortion input voltage range.

7. A linearized Class AB biased differential circuit of claim 1, wherein the output differential current is available as both NPN collectors and PNP collectors.

8. A linearized Class AB biased differential circuit of claim 6, wherein an emitter of each NPN output transistor of the output NPN pair is coupled to an emitter of each PNP output transistor of the output PNP pair such that a common differential signal current flows in both the NPN and PNP collectors outputs.

9. A linearized Class AB biased differential circuit of claim 7, wherein the input stage is used to create a rail-to-rail output operational transconductance amplifier consisting of the sum of a current mirrored output of the NPN collector and a current mirrored output of the PNP collector together with a DC current source.

* * * * *